United States Patent

Paruchuri et al.

[11] Patent Number: 6,027,575
[45] Date of Patent: Feb. 22, 2000

[54] METALLIC ADHESIVE FOR FORMING ELECTRONIC INTERCONNECTS AT LOW TEMPERATURES

[75] Inventors: Mohan R. Paruchuri, Canton; Dongkai Shangguan, Novi, both of Mich.

[73] Assignee: Ford Motor Company, Dearborn, Mich.

[21] Appl. No.: 08/958,235

[22] Filed: Oct. 27, 1997

[51] Int. Cl.[7] .................................................. B23K 35/26
[52] U.S. Cl. ............................................. 148/24; 420/555
[58] Field of Search ........................ 148/24, 26; 420/555

[56] References Cited

U.S. PATENT DOCUMENTS

| | | | |
|---|---|---|---|
| 5,170,930 | 12/1992 | Dolbear et al. | 228/123 |
| 5,221,038 | 6/1993 | Melton et al. | 228/180.2 |
| 5,328,087 | 7/1994 | Nelson et al. | 228/175 |
| 5,429,292 | 7/1995 | Melton et al. | 228/180.22 |
| 5,445,308 | 8/1995 | Nelson et al. | 228/121 |

FOREIGN PATENT DOCUMENTS 2074604  11/1981  United Kingdom ................... 420/555

*Primary Examiner*—George Wyszomierski
*Attorney, Agent, or Firm*—Lorraine S. Melotik

[57] ABSTRACT

The invention is a self-low-temperature curing metallic adhesive with thermal and electrical conductivity. It comprises a paste mixture of a liquid metal having a melting temperature below 30° C. and comprising: (1) 99.2–75 wt. % gallium and (2) aluminum or zinc and (3) optionally tin or indium; and a metallic powder selected from the group consisting of: zirconium, rare earth elements, copper, nickel, silver, antimony, cobalt, chromium, germanium, gold, iron, magnesium, manganese, platinum, palladium, and vanadium, and combinations of any of them.

6 Claims, No Drawings

METALLIC ADHESIVE FOR FORMING ELECTRONIC INTERCONNECTS AT LOW TEMPERATURES

TECHNICAL FIELD

The present invention relates to a metallic adhesive paste useful for forming electronic interconnections, such as between bus connectors, at low temperatures. More particularly, the adhesive composition is formed by mixing a liquid metal comprising an alloy of gallium (Ga) and aluminum (Al) or zinc (Zn), with a metallic powder comprising at least one of zirconium (Zr), rare earths, copper (Cu), nickel (Ni), silver (Ag), antimony (Sb), cobalt (Co), chromium (Cr), germanium (Ge), gold (Au), iron (Fe), magnesium (Mg), manganese (Mn), platinum (Pt), palladium (Pd), and vanadium (V), and combinations thereof.

BACKGROUND OF THE INVENTION

It has been suggested that electronic component designs in automotive vehicles can be simplified as to complexity and weight by assembling the components on thermoplastic substrates, e.g., on the underside of vehicle dashboards. This type of system has been termed Instrument Panel (IP) Super-Integration. In this system, individual electronic circuits are first assembled on thermoplastic substrates, with electronic components attached. Bus connectors, made of copper, extend beyond each such individually assembled circuit, and these bus connectors are to be joined so as to serve as interconnects between different circuits. For this purpose, materials are needed to metallurgically join the bus connectors at low temperatures, so as not to inflict thermally induced damages on the components, thermoplastic substrates with low heat deflection temperatures (HDT), and more importantly, the solder interconnects that have already been formed on each individual circuit.

Solders provide inexpensive, mass-producible and generally reliable interconnections to complete electronic circuitry between various elements that make up an electronic assembly. The solder joints, in addition to being electrical interconnects, serve as the mechanical attachment of the electronic components to the printed circuit board and also to transfer heat. Soldering makes these connections at temperatures below those that might cause damage to some of the elements of the assembly and substrate materials. Eutectic tin/lead (63Sn/37Pb) solder (melting temperature 183° C.) is commonly used for reflow soldering with peak reflow temperature of 210–220° C. so as to completely melt the metals in the solder. In order to use low cost thermoplastic substrate materials and some components which may be temperature-sensitive for integration, it is required to reflow at lower peak temperatures than 200° C.

In such integration applications, the solder joints may experience significant thermal cycling during use. It is known that eutectic 63Sn/37Pb solder joints are reliable during thermal cycling between −40° C. and 125° C. Solders with melting temperatures lower than 180° C. may not be able to withstand this thermal cycling over extended periods of time as is often encountered in automotive use. Many of the low melting temperature solder compositions also have a wide pasty range (up to 30° C.) between solidus and liquidus temperatures that may allow damage to the solder joints during reflow soldering/cooling processes.

Metallic adhesives are an alternative to conventional metal alloy solders and generally comprise a mixture of a liquid metal and particulates. The adhesives form the solder joint when metal (or metal alloy) powders in the metallic adhesives react with the liquid metal (or metal alloy). The formed solder joint has a high post-curing melting temperatures, thereby providing a reliable solder interconnect for automotive use as is the intent of the present invention. Thus metallic adhesives capable of joining electrical connectors like bus connectors at low temperatures might be well adapted for use in , e.g., super-integration systems.

Metallic adhesives have been suggested in several patents. For example, U.S. Pat. Nos. 5,328,087 and CIP 5,445,308 (Nelson et al.) disclose mixing a thermally conductive filler containing a liquid metal into an unhardened adhesive material like epoxies or silicone gels. Disclosed liquid metal is, e.g., gallium, gallium/indium or gallium/tin combinations. The filler can be a gallium/copper/nickel paste which can solidify by amalgamation. One drawback in using these materials to join electrical connectors is the limited metallic contact between the adhesive and the electrical connectors to be jointed. It is appreciated that a continuous metallic medium is critical for reliable electrical connection. Melton et al. in U.S. Pat. No. 5,429,292 disclose a solder paste of compositionally distinct metal powders where a first metal powder of tin/bismuth solder alloy is combined with a second metal powder containing gold or silver. One disadvantage of this solder is that is uses a very expensive metal, gold, and it therefore is unsuitable for large volume use. In another U.S. Pat. No. , 5,221,038, Melton et al. disclose a solder connection formed based upon a tin/indium or tin/bismuth alloy, having a melting temperature greater than the melting temperature of the initial solder alloy.

However, the post-soldering temperature is believed to be still too low for the automotive applications intended for the present invention. In U.S. Pat. No. 5,170,930, Dolbear et al. disclose a liquid metal paste which remains non-solidified in order to make detachable connections. The paste comprises an equilibrium mixture of a liquid metal like gallium or mercury and particulate solid like alumina, cobalt, or glass beads. Obviously, such a material has a specialized use for making detachable connections and is not intended for making a solid and durable electrical interconnection.

It would be desirable to have a metallic adhesive which overcomes the disadvantages of prior art solders and metallic adhesives. One object of such an adhesive would be to be able to join electronic components, e.g., electronic bus connectors, at low temperatures. Such a material would be particularly suitable for use in super-integration systems as are envisioned in the future. Yet another object of the present invention is to have a metallic adhesive that is free of toxic ingredients such as mercury, cadmium, lead, etc. The invention described herein provides metallic adhesives having these properties and excellent electrical and thermal conductivity.

SUMMARY OF THE INVENTION

The present invention is a low temperature self-curing, electrically and thermally conductive metallic adhesive composition. It comprises a paste mixture of: (I.) a liquid metal having a melting temperature below about 30° C. and comprising an alloy of: (1) 99.2–75 wt. % gallium with (2) aluminum or zinc and (3) optionally tin or indium; and (II.) a metallic powder selected from the group consisting of: zirconium, rare earth elements, copper, nickel, silver, antimony, cobalt, chromium, germanium, gold, iron, magnesium, manganese, platinum, palladium, vanadium, and a mixture of any of them. Preferably the liquid metal has a melting temperature below about 22° C.

Advantageously, the metallic adhesive can be dispensed at room temperature, without the need for auxiliary heating as with conventional solders. The metallic adhesive is curable at low temperatures, even room temperature, thereby minimizing damage to electronic components, substrates, and already-formed solder joints on the electronic circuits. Once cured, the metallic adhesive provides interconnects, as for bus connectors, that are reliable over extended periods of time.

It is also a desired feature of the present invention to provide a non-toxic metallic adhesive exhibiting favorable thermal and electrical conductivity and satisfactory mechanical properties. These and other advantages, features and objects of the present invention will become more apparent to those of ordinary skill in the art upon reference to the following description.

DETAILED DESCRIPTION OF THE PREFERRED EMBODIMENTS

As disclosed above, the metallic adhesive of the present invention is a low temperature self-curing paste mixture useful to join electronic interconnects like bus connectors, flip chip attachments, die attachments and still other electronic interconnections, as would be appreciated by those skilled in the art in view of the present disclosure.

To join such electronic interconnects, the metallic adhesive is applied to faying metallic surfaces in appropriate amounts, i.e., to the areas of the interconnects to be jointed, such as the bus connectors, by printing or dispensing the adhesive. The bus connectors are then generally fastened or clamped together with the adhesive paste in between. Use of a flux is optional; if desired, a flux may be applied to the interconnects before applying the adhesive in order to further prepare the interconnect surfaces. The flux may be, but is not limited to, RMA (rosin mildly activated) flux. The surface of the interconnect, e.g., the copper bus connectors, may be optionally coated with other metals, such as a 94.4Ga/3.6Zn (wt.%) alloy in order to improve the wettability of the metallic adhesive on the connector surface. The interconnect adhesive will cure at room temperature although acceleration of the cure, if desired, can be initiated by heating the adhesive, e.g., from 50° C. up to about 150–200° C. for 10–12 minutes; Energy sources, such as oven heating, ultrasound, laser, etc., may be used to accelerate the curing process. The material will cure readily at low (room) temperatures, however, and after only partial curing the adhesive interconnects can be handled without concern for the integrity of the joint. The adhesive will self-cure further at room temperature over time to form a joint having excellent integrity.

The adhesive metallurgically joins with the interconnects, e.g., the copper bus connectors, when the gallium interacts with copper, forming intermetallic compounds. It is further believed that the adhesive cures and hardens by forming intermetallic compounds between the liquid and powder materials, e.g., between gallium and zirconium and also between zirconium and aluminum. These intermetallic compounds have high melting temperatures, and are electrically and thermally conductive, as well as mechanically strong and durable. However, neither the accuracy nor understanding of this theory is necessary for practice of the present invention.

As disclosed above, the metallic adhesive of the present invention is a paste mixture of: (I.) a liquid metal having a melting temperature below 30° C. and comprising: (1) 99.2–75 wt. % gallium (Ga) and (2) aluminum (Al) or zinc (Zn) and (3) optionally tin (Sn) or indium (In); and (II.) a metallic powder, all percentages being weight percents throughout this document when referring to the proportions of the compositions and solders herein. The metallic liquid is preferably selected from:(a) 96.4% gallium (Ga) and 3.6% zinc (Zn); (b) 82% gallium (Ga), 4% zinc (Zn), and 14% tin (Sn); (c) 75% gallium (Ga), 4% zinc (Zn), and 21% indium (In); (d) 99.2% gallium (Ga) and 0.8% aluminum (Al); (e) 85% gallium (Ga), 1% aluminum (Al), and 14% tin (Sn); and (f) 78% gallium (Ga), 1% aluminum (Al), and 21% indium (In).

Most preferably, the metallic liquid has a melting temperature below about 22° C., and thus is more preferably (b): 82% gallium, 4% zinc, and 14% tin; (c): 75% gallium, 4% zinc, and 21% indium; (e) 85% gallium, 1% aluminum, and 14% tin; and (f): 78% gallium, 1% aluminum, and 21% indium, of the above disclosed metallic liquids, with (b): 82% gallium, 4% zinc, and 14% tin, being most preferred. In forming the adhesive at room temperature, it may be necessary to warm these materials to provide them in the liquid state.

The invention metallic adhesive is a paste mixture of the liquid metal and a metallic powder. The powder is selected from the group consisting of: zirconium, rare earth elements, copper, nickel, silver, antimony, cobalt, chromium, germanium, gold, iron, magnesium, manganese, platinum, palladium, and vanadium. Rare earths include numerous elements, as known to those skilled in the art, including cerium (Ce), neodymium (Nd), and others. Generally, the powders desirably comprise about 5–50 wt. percentage of the adhesive. The size of the solid particles ranges from 2 to 75 microns in diameter.

Optimally, to prepare the preferred invention metallic adhesive, the metallic powders employed are 5–10% Zr or 20–40% Cu powders, being most preferably used in combination with the 82Ga-4Zn-14Sn liquid metal disclosed above. Optimally, the metal powder is employed in a size where the average diameter of the particles is about 20–25 microns for formation of the paste. Although particle size is not critical, using this optimal particle size promotes uniform mixing and fast reaction and curing. The materials are mixed to optimally form a substantially homogeneous paste of liquid and powder by any method, including well established methods such as mechanical mixing, blending with an ultrasonically driven pestle, etc.

EXAMPLES

In one example, a mixture of 82Ga-4Zn-14Sn liquid metal and 40% of Zr powders (20–25 microns) is made by blending with an ultrasonically driven pestle. The metallic adhesive is dispensed at room temperature to surfaces of two copper bus connectors. The assembly is clamped together, and cured in an oven at 150° C. for 10–15 minutes to accelerate curing. After this initial curing, the adhesive continues to self-cure at room temperature over time.

In another example, liquid metal 75Ga-4Zn-21In is mechanically mixed with 40% of Cu powders (20–25 microns). The mixture is deposited to bus connectors and the assembly is cured at 100° C. for 20–25 minutes, and then left for self-curing at room temperature over time.

In a third example, 10% Zr and 30% Cu powders and 82Ga-4Zn-14Sn liquid metal are mixed and the mixture is deposited to connector surfaces for self-cure at room temperature.

The metallic adhesive of the present invention is especially useful to provide a durable and damage resistant electrical interconnect for electronic components exposed to wide temperature variations as is commonly found in automotive applications. A common automotive test for measuring the durability of a solder or adhesive interconnect is to expose the interconnect to a large temperature variation, typically from −40 to 125° C., or only 105° C. in applications where components are mounted to thermoplastic substrates in the integration systems mentioned above. As disclosed above, an object of the invention is to provide adhesives useful in such integration systems in automotive vehicles. In this accelerated test, temperature variation is repeated more than one thousand times. Each cycle from hot to cold causes the substrate, electronic component, metal leads and the interconnect to expand and contract (often with widely different Coefficients of Thermal Expansion, or CTE), thus generating thermomechanical stress/strain in the interconnect. The example adhesives described above provide reliable interconnects under such conditions.

The metallic adhesives made according to the present invention is found to be readily manufacturable and utilized existing commercial equipment for manufacturing and usage, and is suitable for production in large commercial quantities. The metallic adhesives of the present invention do not contain toxic ingredients such as mercury, cadmium, lead, etc.

While the best mode for carrying out the present invention has been described in detail, those familiar with the art to which the invention relates will recognize various alternative designs and embodiments for practicing the invention as defined by the following claims.

What is claimed:

1. A low temperature self-curing, electrically and thermally conductive metallic adhesive composition comprising a paste mixture of:

a liquid metal having a melting temperature below about 30° C. and comprising an alloy selected from the group consisting of:
   a) 96.4% gallium and 3.6% zinc;
   b) 82% gallium, 4% zinc, and 14% tin;
   c) 99.2% gallium, 0.8% aluminum;
   d) 85% gallium, 1% aluminum, and 14% tin; and
   a metallic powder selected from the group consisting of: zirconium, rare earth elements, copper, nickel, silver, antimony, cobalt, chromium, germanium, gold, iron, magnesium, manganese, platinum, palladium, and vanadium, and combinations thereof.

2. The metallic adhesive composition according to claim 1 wherein said liquid has a melting temperature below about 22° C.

3. The metallic adhesive composition according to claim 1 wherein said powder is zirconium and it forms 5–50% by weight of the metallic adhesive composition.

4. The metallic adhesive composition according to claim 1 wherein said powder is copper and it forms 5–50% by weight of the metallic adhesive composition.

5. The metallic adhesive composition according to claim 1 wherein said metallic powder is 20–40% copper or 5–10% zirconium, by weight, of the metallic adhesive composition.

6. A low temperature self-curing, electrically and thermally conductive metallic adhesive composition comprising a paste mixture of:

a liquid metal having a melting temperature below about 30° C. and comprising an alloy of: (1) 99.2–75 wt. % gallium and (2) aluminum or zinc, and (3) optionally tin or indium; and
   5–50% by weight of the metallic adhesive composition of a zirconium metallic powder.

* * * * *